United States Patent
Narag et al.

(10) Patent No.: US 10,818,642 B2
(45) Date of Patent: Oct. 27, 2020

(54) MULTILAYER LED SUBSTRATE

(71) Applicant: 3M INNOVATIVE PROPERTIES COMPANY, St. Paul, MN (US)

(72) Inventors: Alejandro Aldrin II A. Narag, Singapore (SG); Ravi Palaniswamy, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 16/243,420

(22) PCT Filed: Jul. 12, 2017

(86) PCT No.: PCT/US2017/041655
§ 371 (c)(1),
(2) Date: Jan. 9, 2019

(87) PCT Pub. No.: WO2018/013645
PCT Pub. Date: Jan. 18, 2018

(65) Prior Publication Data
US 2019/0269016 A1    Aug. 29, 2019

Related U.S. Application Data

(60) Provisional application No. 62/362,609, filed on Jul. 15, 2016.

(51) Int. Cl.
*H01L 25/075*    (2006.01)
*H01L 33/48*    (2010.01)
(Continued)

(52) U.S. Cl.
CPC ........ *H01L 25/0753* (2013.01); *H01L 33/486* (2013.01); *H01L 33/62* (2013.01);
(Continued)

(58) Field of Classification Search
CPC ... H01L 25/0753; H01L 33/486; H01L 33/62; H05K 1/117; H05K 2201/09145; H05K 2201/10106
See application file for complete search history.

(56) References Cited

U.S. PATENT DOCUMENTS

| | | | |
|---|---|---|---|
| 5,660,461 A | * | 8/1997 | Ignatius ............... F21V 29/004 257/668 |
| 7,156,538 B2 | * | 1/2007 | Han .................... H01L 25/0753 257/330 |

(Continued)

FOREIGN PATENT DOCUMENTS

| EP | 1760784 | 3/2007 |
|---|---|---|
| EP | 2824707 | 1/2015 |

(Continued)

OTHER PUBLICATIONS

International Search Report for PCT International Application No. PCT/US2017/041655, dated Oct. 25, 2017, 6 pages.

*Primary Examiner* — Scott B Geyer
(74) *Attorney, Agent, or Firm* — Jonathan L. Tolstedt

(57) ABSTRACT

A flexible multilayer construction (1000) for mounting a plurality of light emitting semiconductor devices (LESDs 100, 110, 120) includes a flexible dielectric substrate (200) comprising top (210) and bottom (220) major surfaces, and pluralities of corresponding electrically conductive top (300, 310, 320, 330) and bottom (500, 510, 520, 530) pads disposed on the top and bottom major surfaces, respectively. An electrically conductive via (400, 410, 420, 430) connects each pair of corresponding top and bottom pads, a side of each top pad partially overlapping a side of the corresponding bottom pad and a side of the substrate, such that in a plan view, each top pad fully overlaps the corresponding bottom pad.

9 Claims, 8 Drawing Sheets

(51) Int. Cl.
*H01L 33/62* (2010.01)
*H05K 1/11* (2006.01)
*H05K 3/00* (2006.01)
*H05K 3/40* (2006.01)

(52) U.S. Cl.
CPC ........... *H05K 1/117* (2013.01); *H05K 3/0052* (2013.01); *H05K 3/0097* (2013.01); *H05K 3/403* (2013.01); *H01L 2224/48091* (2013.01); *H01L 2224/49113* (2013.01); *H05K 2201/049* (2013.01); *H05K 2201/09145* (2013.01); *H05K 2201/09463* (2013.01); *H05K 2201/10106* (2013.01)

(56) References Cited

U.S. PATENT DOCUMENTS

| | | | | |
|---|---|---|---|---|
| 7,473,933 B2 * | 1/2009 | Yan | ................... | H01L 25/0753 257/100 |
| 7,655,957 B2 * | 2/2010 | Loh | ................... | H01L 25/0753 257/100 |
| 8,115,217 B2 * | 2/2012 | Duong | ................... | H01L 33/20 257/88 |
| 8,124,988 B2 * | 2/2012 | Peng | ................... | F21V 19/0025 257/433 |
| 8,384,097 B2 * | 2/2013 | Yan | ........................ | F21K 9/00 257/666 |
| 8,579,428 B2 | 11/2013 | Banning et al. | | |
| 9,345,095 B2 * | 5/2016 | Yan | ........................ | H05B 45/37 |
| 9,450,163 B1 * | 9/2016 | Lowes | ................. | H01L 33/642 |
| 9,642,206 B2 * | 5/2017 | Yan | ........................ | H05B 45/20 |
| 9,653,663 B2 * | 5/2017 | Yan | ................... | H01L 25/0753 |
| 2006/0091416 A1 | 5/2006 | Yan | | |
| 2007/0057364 A1 * | 3/2007 | Wang | ........................ | C03C 8/02 257/701 |
| 2007/0228516 A1 * | 10/2007 | Plank | ................... | A61C 19/003 257/531 |
| 2008/0179618 A1 * | 7/2008 | Cheng | ................... | H01L 33/486 257/99 |
| 2008/0203897 A1 * | 8/2008 | De Samber | ........... | H01L 33/642 313/498 |
| 2009/0050907 A1 * | 2/2009 | Yuan | ...................... | H05B 45/20 257/88 |
| 2009/0052178 A1 * | 2/2009 | Marchl | ............... | H01L 25/0753 362/249.02 |
| 2009/0066877 A1 * | 3/2009 | Abe | ..................... | G02B 6/0021 349/62 |
| 2009/0201699 A1 | 8/2009 | Ohno | | |
| 2009/0278139 A1 * | 11/2009 | Fjelstad | ............... | H01L 25/0753 257/88 |
| 2010/0259930 A1 | 10/2010 | Yan | | |
| 2012/0175643 A1 * | 7/2012 | West | ...................... | H05K 1/021 257/88 |
| 2013/0069089 A1 * | 3/2013 | Hussell | ...................... | F21V 3/00 257/88 |
| 2013/0207133 A1 * | 8/2013 | Reill | ................... | H01L 25/0753 257/88 |
| 2014/0183575 A1 * | 7/2014 | Miyata | ................ | H01L 25/0753 257/88 |
| 2015/0176783 A1 * | 6/2015 | Hata | ................... | H05K 1/0278 362/223 |
| 2018/0259166 A1 * | 9/2018 | Min | ........................ | F21K 9/00 |

FOREIGN PATENT DOCUMENTS

| | | |
|---|---|---|
| EP | 2930748 | 10/2015 |
| JP | 2006-156643 | 6/2006 |
| JP | 2013-065899 | 4/2013 |

\* cited by examiner

MULTILAYER LED SUBSTRATE

BACKGROUND

Printed circuit boards contain multiple layers of conductive metal sheets and non-conductive substrates. Vias are used to electrically connect one or more of the conductive metal sheets between the substrate layers. Vias are conventionally manufactured by drilling holes in the circuit board after the circuit board layers have been fabricated. As chip density increases, mechanical and punched drills may not be able to form holes sufficiently small for some circuit board and chip designs.

One example of a high density application is a Red/Green/Blue (RGB) light emitting diode (LED) backlight chip. Printed circuit boards for RGB LED chips can be made from two metal layers separated by a dielectric substrate. The top metal layer may be connected to a chip, while the bottom metal layer may be soldered to a printed circuit board. The two metal layers are connected by a via structure.

SUMMARY

In general, this disclosure is directed to a flexible multilayer construction that can be used to mount and electrically couple light emitting semiconductor devices (LESDs) to underlying electronic devices. Each multilayer construction may have a plurality of electrically conducting top pads and bottom pads electrically connected by vias. One or more LESDs may be connected to the top pads and independently energized.

During fabrication, a multilayer film may contain an array of top pads and bottom pads disposed on opposite surfaces of a substrate and connected by a conducting path. To form the constructions, the film may be cut through these top pads, bottom pads, and conducting paths, so that the resulting constructions' top pads, bottom pads and conducting paths are a fraction of their original size and separated into electrically isolated corners of the construction. These constructions may be used in applications where via hole size may limit the size of the substrate. A conventionally-sized via hole may be divided into sections, such that the resulting via hole may be smaller, allowing for higher density chips.

In one aspect, the present disclosure is directed to a flexible multilayer construction for mounting at least three light emitting semiconductor devices includes a flexible dielectric substrate, electrically conductive first through fourth top pads, and electrically conductive vias. The flexible dielectric substrate has a top major surface, a bottom major surface, and a common LESD mounting region on the top major surface for receiving the at least three LESDs. The common LESD mounting region has a maximum projected area less than about 0.25 $mm^2$. The electrically conductive first through fourth top pads are spaced apart and disposed entirely within the common LESD mounting region for electrically connecting to electrically conductive terminals of the at least three LESDs received in the common LESD mounting region. The electrically conductive vias extend from each of the first through fourth top pads to the bottom major surface. When the at least three LESDs are received and electrically connected to the first through fourth top pads, each of the at least three LESDs can be independently energized.

In another aspect, the present disclosure is directed to a LESD package includes a flexible dielectric substrate, electrically conductive first through fourth pads, electrically conductive vias, and first through third LESDs. The flexible dielectric substrate includes opposing top and bottom major surfaces and a common LESD mounting region on the top major surface. The common LESD mounting region has a maximum projected area less than about 1 $mm^2$. The electrically conductive first through fourth pads are spaced apart and disposed entirely within the common LESD mounting region. The electrically conductive vias extend from each of the first through fourth pads to the bottom major surface. The first through third LESDs are mounted in the common LESD mounting region, an electrically conductive first terminal of each LESD in the first through at least third LESDs electrically connected to a different pad in the first through fourth pads, electrically conductive second terminals of at least two LESDs in the first through third LESDs electrically connected to a same pad in the first through fourth pads, such that each of the first through third LESD is independently energizable.

In another aspect, the present disclosure is directed to a flexible multilayer construction for mounting a plurality of light emitting semiconductor devices (LESDs) includes a flexible dielectric polygonal substrate, a plurality of spaced apart electrically conductive top pads, a plurality of electrically conductive bottom pads, and a plurality of electrically conductive vias. The flexible dielectric polygonal substrate includes a plurality of sides intersecting at a plurality of vertices and includes top and bottom major surfaces. The plurality of electrically conductive top pads are spaced apart and disposed on the top major surface of the substrate. The plurality of electrically conductive bottom pads are spaced apart and disposed on the bottom major surface of the substrate. The plurality of electrically conductive vias extend between corresponding top and bottom pads, such that for each corresponding top and bottom pad, the top and bottom pads are each polygonal having a plurality of sides intersecting at a plurality of vertices, a first vertex of the top pad coincident with a first vertex of the bottom pad and a first vertex of the substrate, the sides of the top and bottom pads and the substrate intersecting at the first vertex and partially overlapping one another.

In other embodiments, the present disclosure is directed to a flexible multilayer construction for mounting a plurality of light emitting semiconductor devices (LESDs) includes a flexible dielectric substrate comprising top and bottom major surfaces, and pluralities of corresponding electrically conductive top and bottom pads disposed on the top and bottom major surfaces, respectively. An electrically conductive via connects each pair of corresponding top and bottom pads, a side of each top pad partially overlapping a side of the corresponding bottom pad and a side of the substrate, such in a plan view, each top pad fully overlaps the corresponding bottom pad.

In another aspect, the present disclosure is directed to a method of fabricating a flexible multilayer construction for mounting a plurality of light emitting semiconductor devices (LESDs), includes the steps of: forming a patterned multilayer film; determining a plurality of cutting lines on the patterned multilayer film, the cutting lines dividing the first and second pads in each corresponding first and second pads and the conductive path connecting the first and second pads each into four sections; and singulating a flexible multilayer construction by cutting through the patterned multilayer film along the determined cutting lines, resulting in the flexible multilayer construction having a plurality of corresponding top and bottom pads connected by corresponding electrically conductive vias, each top and bottom pad extending to a side of the flexible multilayer construction. Forming a patterned multilayer film further includes: providing a flexible substrate having opposing top and bottom major surfaces; forming a plurality of spaced apart electrically conductive first pads on the top major surface of the flexible substrate; forming a plurality of spaced apart electrically conductive second pads on the bottom major surface of the flexible substrate in a one to one correspondence with the first pads; and forming an electrically conductive path between corresponding first and second pads through the flexible substrate.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawings indicate like elements. Dotted lines indicate optional or functional components, while dashed lines indicate components out of view.

DETAILED DESCRIPTION

Figure 1:
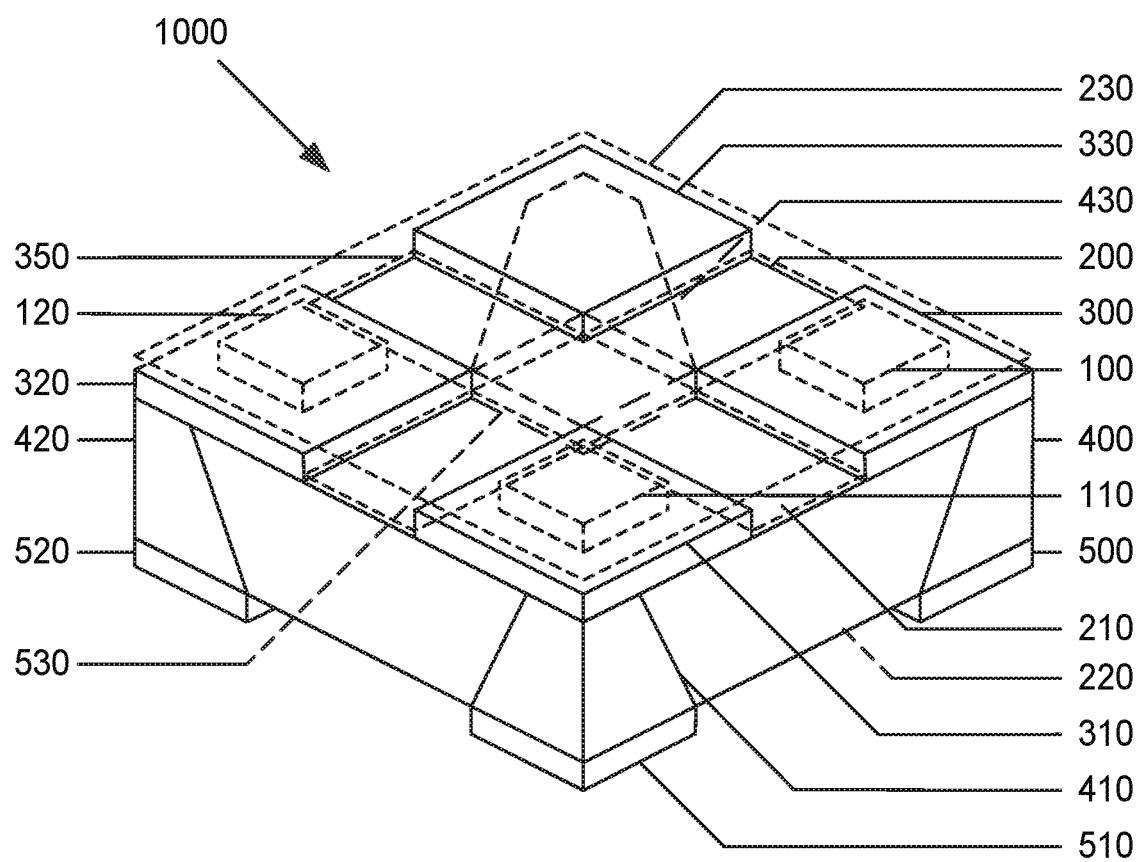
FIG. 1 is a schematic, perspective view diagram of a flexible multilayer construction.

FIG. 1 is a schematic, perspective view diagram of a flexible multilayer construction 1000. The flexible multilayer construction 1000 may include a flexible substrate 200. The flexible substrate 200 may attach, support, and electrically isolate certain components of the flexible multilayer construction 1000. The flexible substrate 200 has a top major surface 210 and a bottom major surface 220. In some embodiments, the flexible substrate 200 may be a dielectric material including, but not limited to, FR-1, FR-2, FR-3, FR-4, FR-5, FR-6, G-10, G-11, CEM-1, CEM-2, CEM-3, CEM-4, CEM-5, PTFE, RF-35, alumina, and polyimide. Properties for which the flexible substrate 200 may be selected include, but are not limited to, flame retardancy, glass transition temperature, decomposition temperature, coefficient of thermal expansion, thermal conductivity, electrical resistance, dielectric constant, strength, flexibility, and moisture absorption.

The flexible multilayer construction 1000 may have a common LESD mounting region 230 on the top major surface 210 for receiving LESDs 100, 110, 120. The common LESD mounting region 230 may be a functional two dimensional area at or near a surface of the flexible multilayer construction 1000 configured to receive one or more LESDs 100, 110, 120. The common LESD mounting region 230 may not be limited to the surface area of the top major surface 210, and may include the surface of other components on the flexible multilayer construction 1000. In the example of FIG. 1, the common LESD mounting region 230 contains three LESDs 100, 110, 120; however, in other embodiments, the common LESD mounting region 230 may greater or fewer LESDs, such as four LESDs.

The flexible multilayer construction 1000 may include a plurality of electrically conductive top pads 300, 310, 320, 330, disposed entirely within the common LESD mounting region 230. The plurality of electrically conductive top pads 300, 310, 320, 330, may be used for electrically connecting the LESDs 100, 110, 120. A variety of materials may be used for the electrically conductive top pads 300, 310, 320, 330, including, but not limited to, copper, gold, nickel, and stainless steel. Properties for which the electrically conductive top pads 300, 310, 320, 330, may be selected include, but are not limited to, electrical conductivity and thermal conductivity. The electrically conductive top pads 300, 310, 320, 330, may create interconnecting grooves 350 that may contain other components, such as reflective coatings, insulative coatings, or heat dissipating coatings. In some embodiments, for example, the interconnecting grooves 350 are at least partially filled with an electrically insulative reflective material having an average reflectance of at least 70% in a visible range of the spectrum.

The flexible multilayer construction 1000 may also include a plurality of vias 400, 410, 420, 430, each extending from one of the top pads 300, 310, 320, 330, to the bottom major surface 220. The plurality of vias 400, 410, 420, 430 can be used to electrically connect the top pads 300, 310, 320, 330, to the bottom major surface 220. In some embodiments, the vias 400, 410, 420, 430, filled with electrically conductive material to form electrically conductive paths between the top and bottom major surfaces 210, 220. A variety of materials may be used for the vias 400, 410, 420, 430, including, but not limited to, lead, tin, silver, copper, zinc, and indium. Properties for which the material of the vias 400, 410, 420, 430, may be selected include, but are not limited to, electrical conductivity thermal conductivity, tensile strength, shear strength, toxicity, melting point.

Electrically conductive bottom pads 500, 510, 520, 530, may be disposed on and spaced apart at the bottom major surface 220. The electrically conducting bottom pads 500, 510, 520, 530, may seat and electrically connect the flexible multilayer construction 1000 with a component on which the flexible multilayer construction 1000 is mounted. Any or all of corresponding top pads 300, 310, 320, 330, vias 400, 410, 420, 430, and bottom pads 500, 510, 520, 530, may be in electrical contact. A variety of materials may be used for the electrically conductive bottom pads 500, 510, 520, 530, including, but not limited to, copper, gold, nickel, and stainless steel. Properties for which the electrically conductive bottom pads 500, 510, 520, 530, may be selected include, but are not limited to, electrical conductivity and thermal conductivity.

One or more LESDs 100, 110, 120, may be mounted and electrically connected to the flexible multilayer construction 1000 through the top pads 300, 310, 320, 330. In some embodiments, the LESDs are LEDs. The flexible multilayer construction 1000 may be configured so that each LESD 100, 110, 120, received and electrically connected to the top pads 300, 310, 320, 330, may be independently energized.

Figure 2:
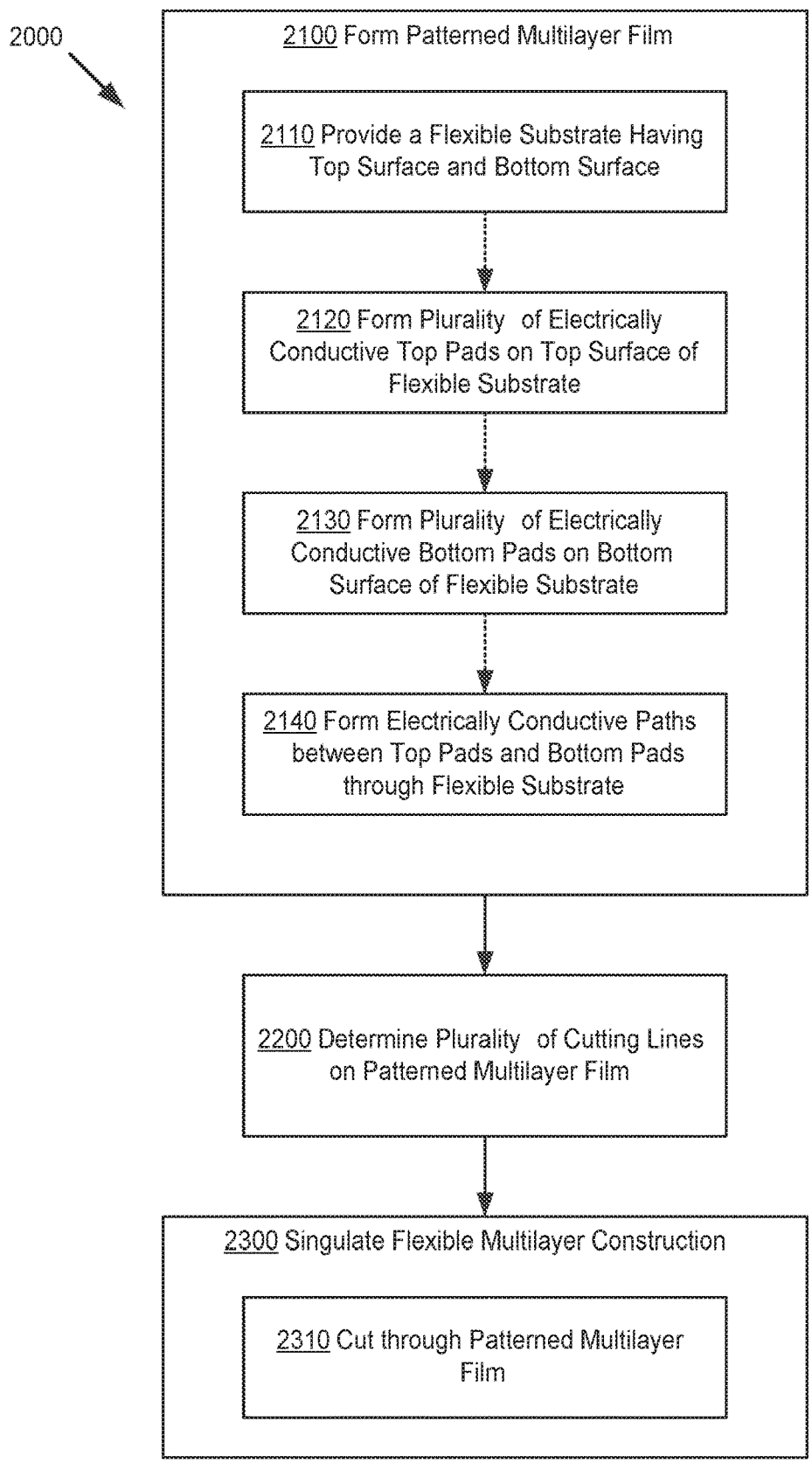
FIG. 2 is a flowchart for a method for fabricating a flexible multilayer construction.

FIG. 2 is a flowchart for a method 2000 for fabricating a flexible multilayer construction such as, for example, the construction 1000 shown in FIG. 1. In some embodiments, steps of the method 2000 are carried out sequentially. A patterned multilayer film may be formed, as in step 2100. To form the patterned multilayer film, a flexible substrate having a top major surface and a bottom major surface may be provided, as in step 2110. The flexible substrate may correspond to the flexible substrate 200 of the flexible multilayer construction 1000 in FIG. 1.

Figure 3A:
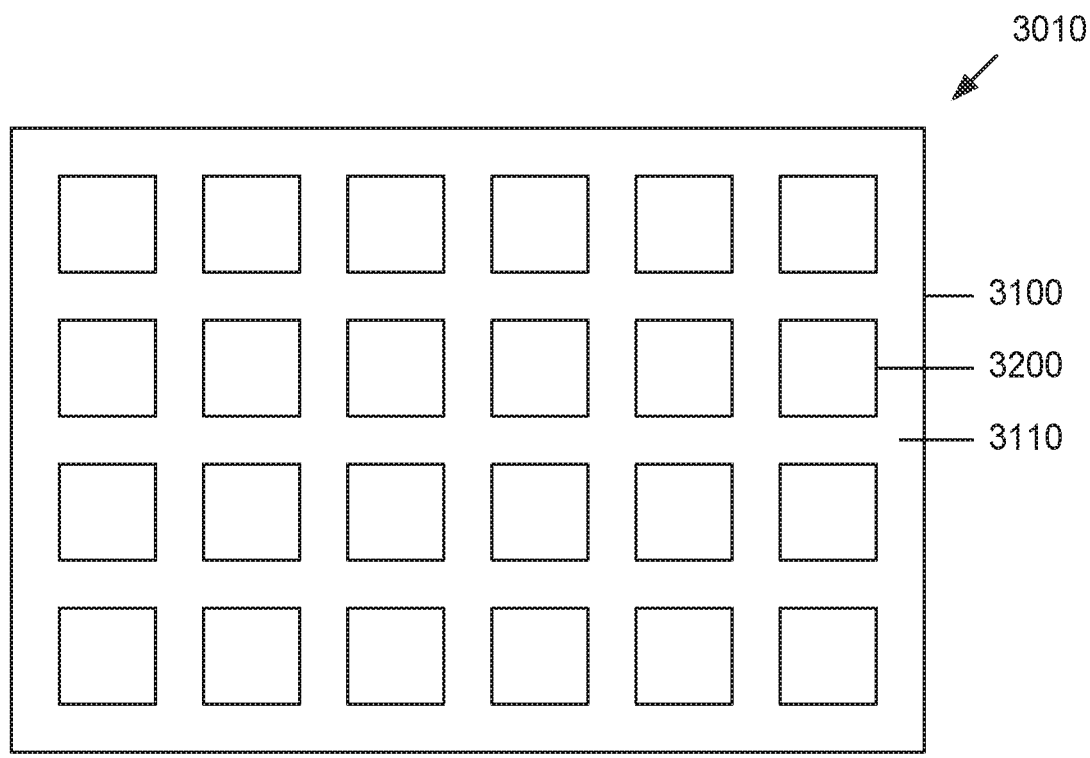
FIG. 3A is a schematic, top view diagram of a multilayer film.

A plurality of spaced apart electrically conductive first pads may be formed on the top major surface of the substrate, as in step 2120. The electrically conductive first pads may correspond to the top pads 300, 310, 320, 330, of the flexible multilayer construction 1000. The electrically conductive first pads may form a two dimensional top array circuit on the top major surface of the flexible substrate. In some embodiments, the electrically conductive first pads may be spaced close enough for an LESD to span or connect between two adjacent first pads. FIG. 3A is a schematic, top view diagram of a multilayer film 3010, such as may be fabricated in step 2120. A flexible substrate 3100 has a top major surface 3110. A plurality of spaced apart, conductive first pads 3200 are disposed on the top major surface 3110 of the flexible substrate 3100.

Figure 3B:
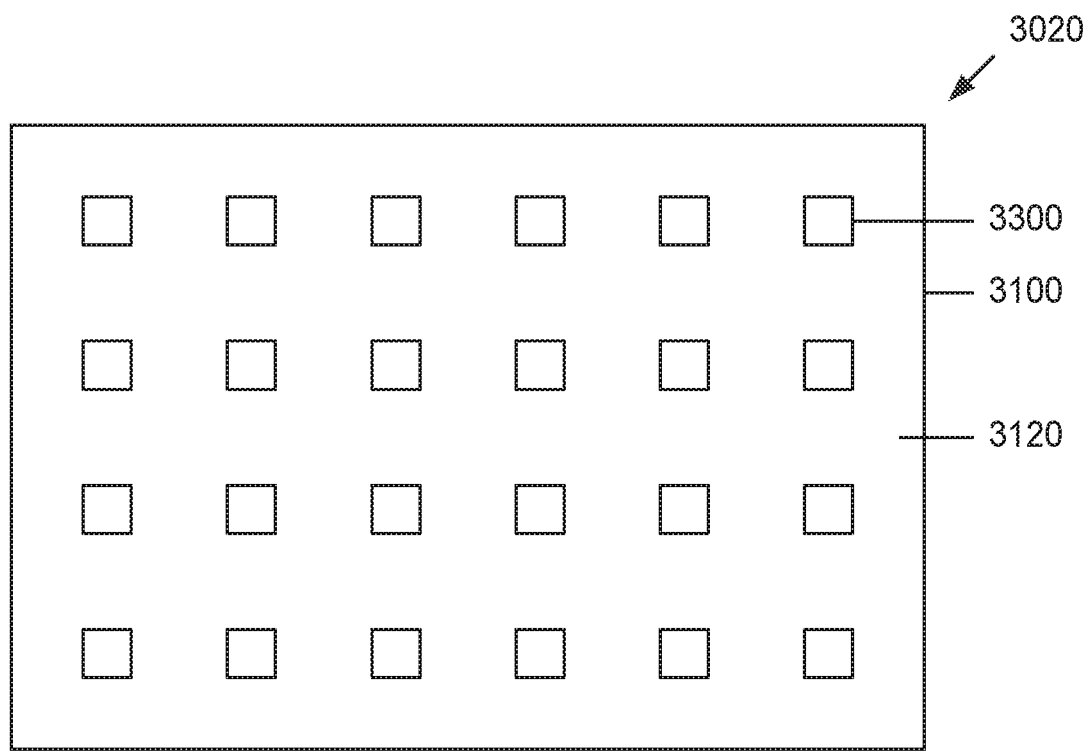
FIG. 3B is a schematic, bottom view diagram of a multilayer film.

Referring again to FIG. 2, a plurality of spaced apart electrically conductive second pads may be formed on the bottom major surface of the substrate, as in step 2130. The electrically conductive second pads may correspond to the bottom pads 500, 510, 520, 530, of the flexible multilayer construction 1000 of FIG. 1. The electrically conductive second pads may form a two dimensional bottom array circuit that corresponds to the two dimensional top array circuit. In some embodiments, the second pads may be disposed in a one to one correspondence with the first pads. In some embodiments, the second pads are centered opposite the first pads. FIG. 3B is a schematic, bottom view diagram of a multilayer film 3020, such as may be fabricated in step 2130. The flexible substrate 3100 has a bottom major surface 3120. A plurality of spaced apart, electrically conductive second pads 3300 are distributed on the bottom major surface 3120 of the flexible substrate 3100.

Referring back to FIG. 2, electrically conductive paths between corresponding first pads and second pads may be formed through the substrate, as in step 2140. In some embodiments, this conductive path formation may be performed after placement of the first and second pads, while in other embodiments, the conductive path formation may be performed before either of the placement of first or second pads. In some embodiments, forming the electrically conducting vias may include forming a hole in the substrate and filling the hole with electrically conducting material. As examples, which are not intended to be limiting, a laser, a drill, or an etching process may form a via through the top and bottom pads, which may subsequently be filled with solder.

Figure 3C:
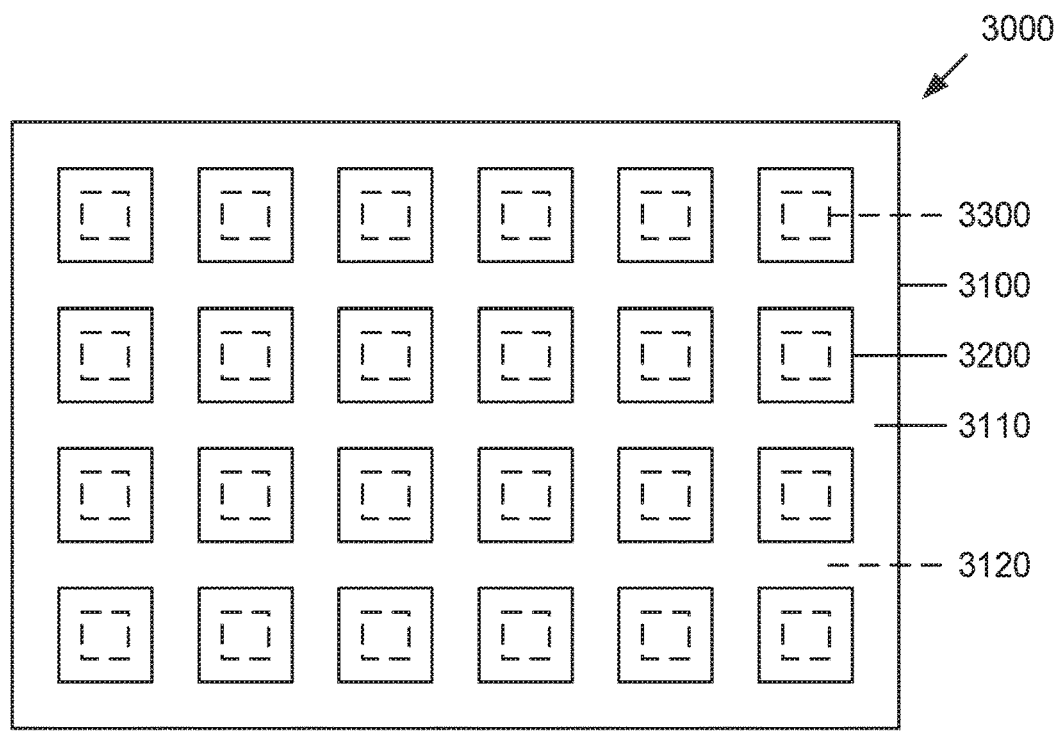
FIG. 3C is a schematic, top view diagram of a patterned multilayer film.

The resulting patterned multilayer film from step 2100 may have a plurality of spaced apart electrically conductive first pads overlapping a plurality of electrically conductive second pads, where the first pads and the second pads are electrically coupled through an electrically conductive path. The electrically conductive first pads and second pads may form a two dimensional array along different first (x) and second (y) directions. In some embodiments, the directions are orthogonal. In some embodiments, the first pads are larger than the second pads, and each second pad is substantially centered under its corresponding first pad. FIG. 3C is a schematic, top view diagram of a patterned multilayer film 3000, such as may be fabricated in step 2100. The flexible substrate 3100 includes the top major surface 3110, the bottom major surface 3120, and the first pads 3200 overlapping the second pads 3300. Each of the first pads 3200 and second pads 3300 may be electrically connected by electrically conductive paths that extend through the substrate 3100 from the top major surface 3110 to the bottom major surface 3120.

Figure 3D:
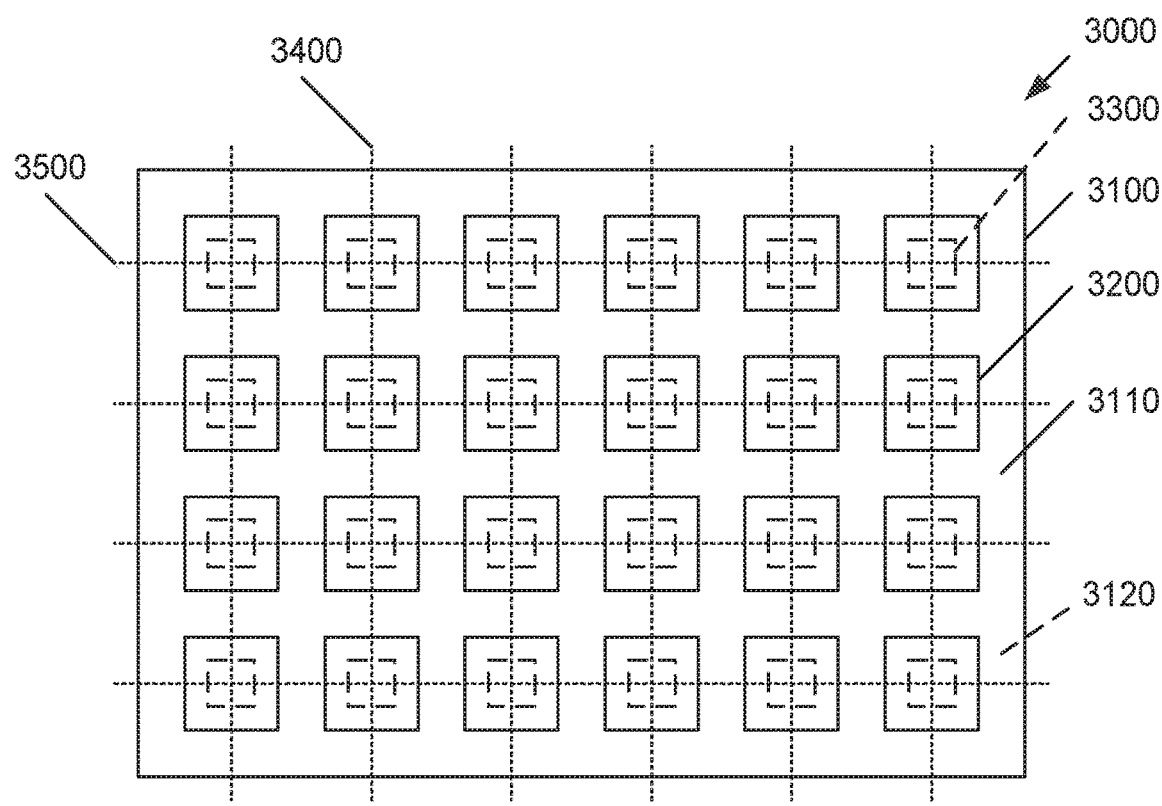
FIG. 3D is a schematic, top view diagram of a patterned multilayer film.
Figure 3E:
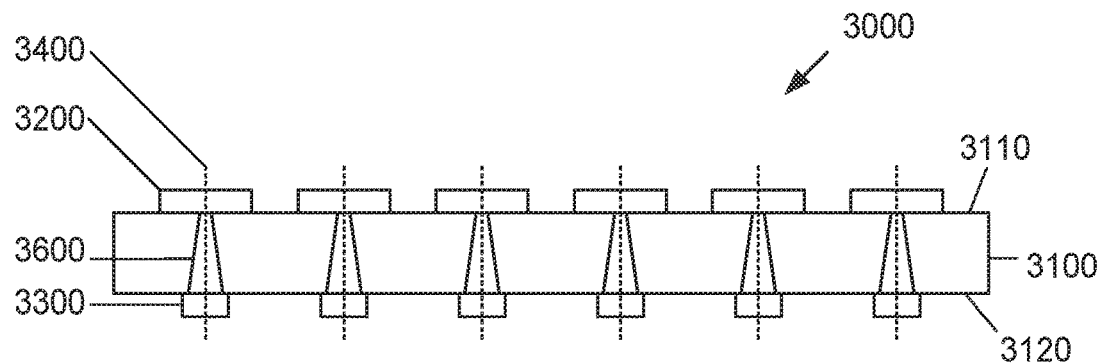
FIG. 3E is a schematic, sectional side view diagram of a patterned multilayer film.

Referring back to FIG. 2, a plurality of cutting lines are determined on the patterned multilayer film, as in step 2200. The cutting lines may be determined to divide the first pads, the second pads, and the conducting paths each into four sections. In some embodiments, each section is equal. The cutting lines may be arranged along the two dimensional arrays of the top and bottom array circuits discussed above. The cutting lines may be along the first and second directions of the array discussed above. In some embodiments, the cutting lines are orthogonal. FIG. 3D is a schematic, top view diagram of a patterned multilayer film 3000. The patterned multilayer film 3000 may include the top major surface 3110, the bottom major surface 3120, the first pads 3200, and the second pads 3300. The patterned multilayer film 3000 may be patterned with a plurality of cutting lines 3400, 3500, determined to divide the first pads 3200 and second pads 3300 into four sections. In this example, the cutting lines 3400, 3500, are oriented around the x-axis and y-axis, respectively. In other embodiments, the cutting lines may divide the first pads and second pads into three sections. FIG. 3E is a schematic, sectional diagram of the patterned multilayer film 3000. An electrically conductive path 3600 from the top major surface 3110 to the bottom major surface 3120 connects the first pads 3200 and the second pads 3300, through which a cutting line 3400 is determined.

Figure 3F:
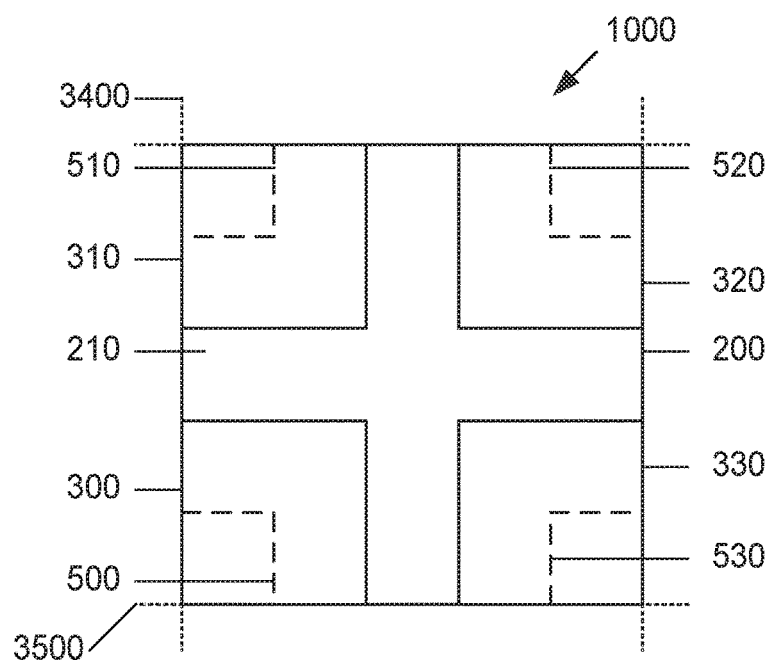
FIG. 3F is a schematic, top view diagram of a flexible multilayer construction.
Figure 3G:
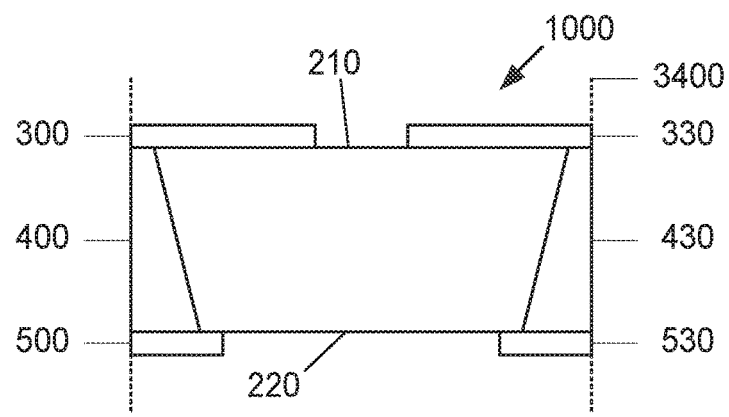
FIG. 3G is a schematic, sectional side view diagram of the flexible multilayer construction of FIG. 3F.

Referring again to FIG. 2, one or more flexible multilayer constructions may be singulated from the patterned multilayer film, as in step 2300. This may be done by cutting through the patterned multilayer film, as in step 2310, such as with a dicing saw or laser. The resulting flexible multilayer construction may have a plurality of corresponding top and bottom pads connected by corresponding electrically conductive vias, each top and bottom pad extending to an edge of the multilayer construction and isolated from other top and bottom pads on the flexible multilayer construction. The singulation process of step 2300 may result in vias that are a fraction of the size of the original vias. In some embodiments, the resulting flexible multilayer constructions have first pads, second pads, and a substrate that have at least two overlapping sides and at least one overlapping vertex. FIG. 3F is a schematic, top view diagram of a flexible multilayer construction 1000 resulting from the step 2300. A plurality of top pads and a plurality of bottom pads extend to an edge of the flexible multilayer construction 1000. A plurality of top pads 300, 310, 320, 330 on a top major surface 210 of a flexible substrate 200, as well as a plurality of bottom pads 500, 510, 520, 530 on a bottom surface 220 of the flexible substrate 200, may be formed by cutting lines 3500 and 3600. FIG. 3G is a schematic, sectional view diagram of the flexible multilayer construction 1000 of FIG. 3F. A first and second top pad 300 and 330, a first and second via 400 and 430 extending from a top major surface 210 to a bottom major surface 220, and a first and second bottom pad 500 and 530 may be formed on two sides of the flexible multilayer construction 1000 by the cutting lines 3400.

Figure 4:
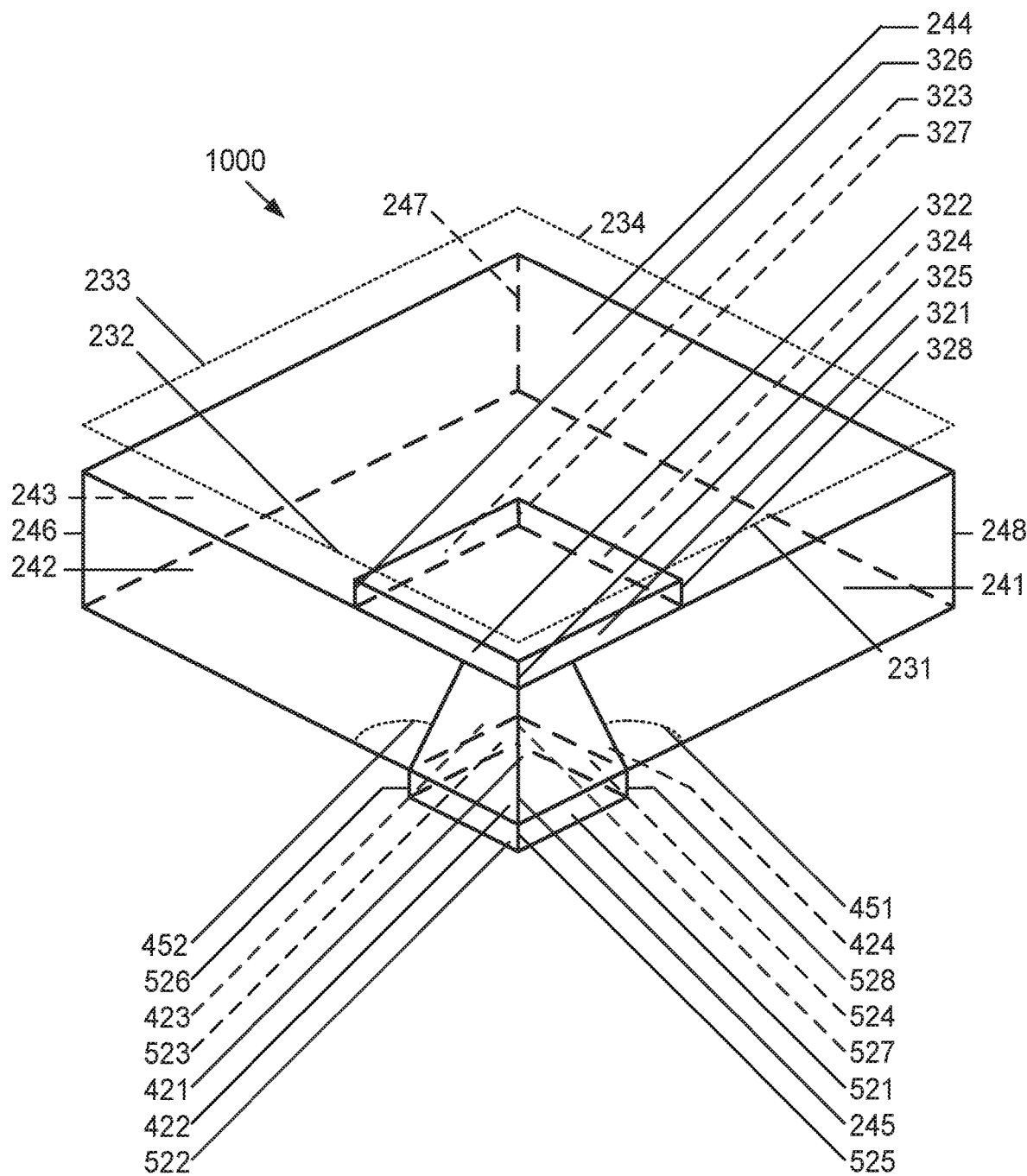
FIG. 4 is a schematic, perspective view diagram of a flexible multilayer construction.

FIG. 4 is a perspective diagram of a flexible multilayer construction 1000. Only one corner of the flexible multilayer construction 1000 is shown for illustration purposes. The top pad (320 of FIG. 1), via (420 of FIG. 1), and bottom pad (520 of FIG. 1) shown may be present on one or more corners on the flexible multilayer construction 1000.

In some embodiments, the flexible multilayer construction 1000 is polygonal, such as a square or triangle shape. In some embodiments, the flexible multilayer construction has a lateral dimension along each of two orthogonal lateral directions that is less than about 0.5 mm, or less than about 0.4 mm, or less than about 0.3 mm.

The common LESD mounting region may have edges 231, 232, 233, 234 that define a functional area of the common LESD mounting region. In some embodiments, the common LESD mounting region 230 and the flexible multilayer construction 1000 may be substantially coextensive and have substantially coincident parameters. In the example of FIG. 4, top pad sides 321, 322, and bottom pad sides 521, 522, extend to common LESD mounting region edges 231, 232. In some embodiments, the common LESD mounting region 230 may have a projected area of less than about 1 mm$^2$, or less than about 0.25 mm$^2$.

The flexible substrate may have a plurality of sides 241, 242, 243, 244, intersecting at a plurality of vertices 245, 246, 247, 248. Each top pad may have a plurality of sides 321, 322, 323, 324, intersecting at a plurality of vertices 325, 326, 327, 328. Each bottom pad may have a plurality of sides 521, 522, 523, 524 intersecting at a plurality of vertices 525, 526, 527, 528. In some embodiments, each top pad, bottom pad, and substrate is polygonal, such as a square, rectangle, or triangle. In other embodiments, only one side from each top pad, each corresponding bottom pad, and the substrate may overlap.

In the example of FIG. 4, substrate sides 241, 242, top pad sides 321, 322, and bottom pad sides 521, 522, overlap each other, while substrate vertex 245, top pad vertex 325, and bottom pad vertex 525 coincide with one another. In other embodiments, the substrate sides 241, 242, top pad sides 321, 322, and bottom pad sides 521, 522, may partially overlap each other. In other embodiments, at least one of the first through fourth top pads extends laterally beyond the electrically conductive pad extending from the top pad.

Each via may have a plurality of sides 421, 422, 423, 424, extending from the top pad to the bottom pad, where one or more interior sides 423, 424, may intersect the flexible substrate. In some embodiments, an interior side 423 is coincident with a minor side surface of the flexible substrate extending between the top and bottom major surfaces, while in other embodiments, two interior sides 423, 424, are each coincident with corresponding minor side surfaces of the flexible substrate extending between the top and bottom major surfaces.

Each interior side 423, 424, may form a via angle 451, 452, with the flexible substrate at the side 241, 242 of the substrate and the side 421, 422, of the via, as viewed from a minor side perspective. In this example, the via is polygonal; however, in other embodiments, the via may have one or more interior sides that are not substantially flat. For example, if a circular drill bit is used to form the electrically conductive path in step 2140 of FIG. 2, then each via would have a pie shape, with two flat sides and a curved side, and interior sides 421 and 422 would be the same side. The degree of the via angles 451, 452, formed by the interior sides 423, 424, may be related to the method and conditions of electrically conducting path formation of step 2140. In this example, via side 241 has a via angle 452 that is substantially perpendicular to top pad side 321 and bottom pad side 521, while via side 244 forms a via angle 451 having an oblique angle with the top major surface of the substrate. In some embodiments, at least one via angle 451, 452, is in a range from about 25 degrees to about 40 degrees.

The substrate vertices 245, 246, 247, 248, formed by the substrate sides 241, 242, 243, 244, may not be present on the corner of the substrate itself, as shown in FIG. 4, but rather may be present on a corner of the via. Each via may be positioned at a different substrate vertex 245, 246, 247, 248. In the example of FIG. 4, the via is positioned at substrate vertex 245 and coincides with top pad vertex 325 and bottom pad vertex 525.

Figure 5A:
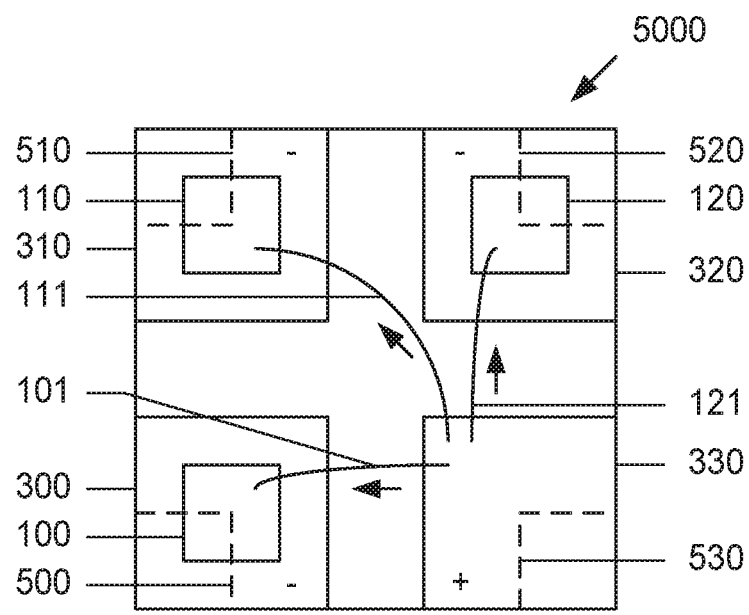
FIG. 5A is a schematic, top view diagram of a flexible multilayer construction having three LESDs each mounted on a single respective top pad.

FIG. 5A is a schematic, top diagram of a flexible multilayer construction 5000 having three LESDs 100, 110, 120, each mounted on a single respective top pad 300, 310, 320. Positive top pad 330 is connected to LESD 100 by a first terminal connector 101, to LESD 110 by a second terminal connector 111, and to a LESD 120 by a third terminal connector 121. In this example, current entering the flexible multilayer construction 5000 at bottom pad 530 flows to top pad 330, through each terminal connector 101, 111, 121, to each respective LESD 100, 110, 120, each respective top pad 300, 310, 320, 330, and each respective bottom pad 500, 510, 520, 530.

Figure 5B:
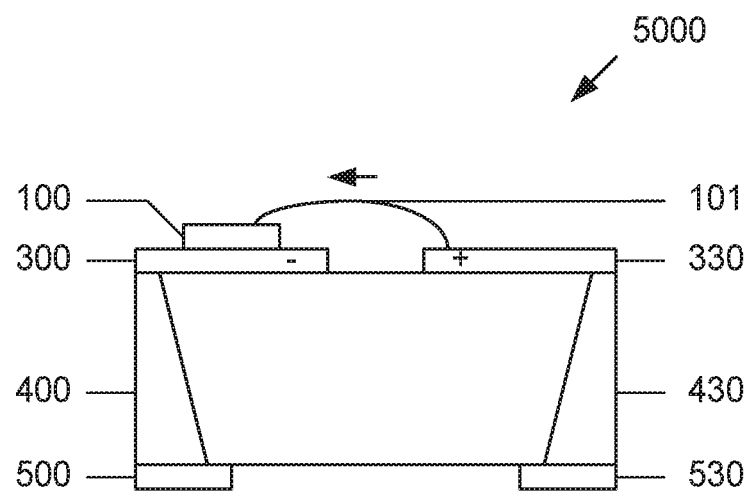
FIG. 5B is a schematic, sectional diagram of the flexible multilayer construction of FIG. 5A.

FIG. 5B is a schematic, sectional diagram of the flexible multilayer construction of FIG. 5A. Current travels from bottom pad 530 through via 430 to top pad 330, where it is carried by terminal connector 101 to LESD 100. The circuit is completed by top pad 300, via 100, and bottom pad 500, which may be connected to a component electrically connected to bottom pad 500.

The flexible multilayer construction 5000 of FIG. 5A and FIG. 5B may be used in RGB LED systems. For example, LESD 100 may be a red LED, LESD 110 may be a green LED, and LESD 120 may be a blue LED. Such small RGB LEDs may be particularly suitable in display devices where a high resolution is desired.

Figure 5C:
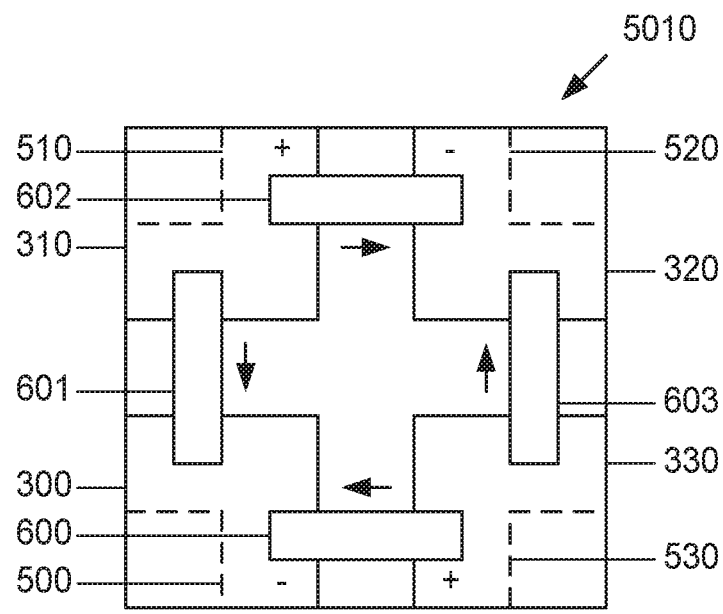
FIG. 5C is a schematic, top view diagram of a flexible multilayer construction having four LESDs, each mounted on two respective top pads.

FIG. 5C is a schematic, top view diagram of a flexible multilayer construction 5010 having four LESDs 600, 601, 602, 603, each mounted on two respective top pads 300, 310, 320, 330. Positive top pad 310 is electrically connected to negative top pads 300 and 320 by LESDs 601 and 602, respectively. Positive top pad 330 is electrically connected to negative top pads 300 and 320 by LESDs 600 and 603, respectively. In this example, electrical current entering bottom pads 510 and 530 flows to respective top 10 pads 310 and 330, through respective LESDs 601 and 602, and 600 and 603, respectively, and out through respective bottom pads 510 and 520, and 500 and 530, respectively.

Figure 5D:
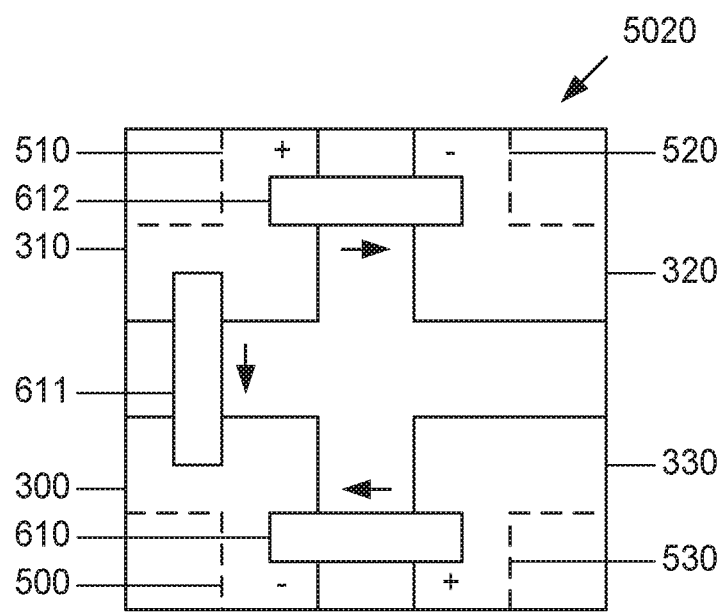
FIG. 5D is a schematic, top view diagram of a flexible multilayer construction having three LESDs, each mounted on two respective top pads.

FIG. 5D is a schematic, top view diagram of a flexible multilayer construction 5020 having three LESDs 610, 611, 612, each mounted on two respective top pads 300, 310, 320, 330. Positive top pad 310 is electrically connected to negative top pads 300 and 320 by LESDs 611 and 612, respectively. Positive 15 top pad 330 is electrically connected to negative top pad 300 by LESD 610. In this example, electrical current entering bottom pads 510 and 530 flows to respective top pads 310 and 330, through respective LESDs 611 and 612, and 610, respectively, and out through respective bottom pads 510 and 520, and 500, respectively.

The following are embodiments of the present disclosure:

Embodiment 1 is a flexible multilayer construction for mounting at least three light emitting semiconductor devices (LESDs), comprising: a flexible dielectric substrate comprising a top major surface, a bottom major surface, and a common LESD mounting region on the top major surface for receiving the at least three LESDs, the common LESD mounting region having a maximum projected area less than about 0.25 mm$^2$; spaced apart electrically conductive first through fourth top pads disposed entirely within the common LESD mounting region for electrically connecting to electrically conductive terminals of the at least three LESDs received in the common LESD mounting region; and an electrically conductive via extending from each of the first through fourth top pads to the bottom major surface, such that when the at least three LESDs are received and electrically connected to the first through fourth top pads, each of the at least three LESDs can be independently energized.

Embodiment 2 is the flexible multilayer construction of embodiment 1, wherein the flexible multilayer construction and the common LESD mounting region are substantially coextensive and have substantially coincident parameters.

Embodiment 3 is the flexible multilayer construction of embodiment 1, wherein each top pad extends to an edge of the common LESD mounting region.

Embodiment 4 is the flexible multilayer construction of embodiment 1 having a lateral dimension less than about 0.5 mm along each of two orthogonal lateral directions.

Embodiment 5 is the flexible multilayer construction of embodiment 1 having a lateral dimension less than about 0.4 mm along each of two orthogonal lateral directions.

Embodiment 6 is the flexible multilayer construction of embodiment 1 having a lateral dimension less than about 0.3 mm along each of two orthogonal lateral directions.

Embodiment 7 is the flexible multilayer construction of embodiment 1, wherein the common LESD mounting region is configured to receive up to four LESDs.

Embodiment 8 is the flexible multilayer construction of embodiment 1, wherein the substrate and the top pads are polygonal with a plurality of sides intersecting at a plurality of vertices, such that for each top pad, two sides of the substrate fully overlap two sides of the top pad and a vertex of the substrate coincides with a vertex of the top pad.

Embodiment 9 is the flexible multilayer construction of embodiment 8, wherein the electrically conductive vias connect each top pad to a corresponding bottom pad disposed on the bottom major surface of the substrate, the bottom pad being polygonal with a plurality of sides intersecting at a plurality of vertices, such that for each bottom pad, two sides of the substrate fully overlap two sides of the bottom pad and a vertex of the substrate coincides with a vertex of the bottom pad.

Embodiment 10 is the flexible multilayer construction of embodiment 8, wherein each conductive via comprises a plurality of sides extending between corresponding top and bottom pads, at least a first side in the plurality of sides substantially perpendicular to the top and bottom major surfaces of the substrate, at least a second side in the plurality of sides making an oblique angle with one of the top and bottom major surfaces of the substrate.

Embodiment 11 is the flexible multilayer construction of embodiment 10, wherein the oblique angle is in a range from about 25 degrees to about 40 degrees.

Embodiment 12 is the flexible multilayer construction of embodiment 10, wherein, in a top plan view, the at least a first side is coincident with a minor side surface of the substrate extending between the top and bottom major surfaces.

Embodiment 13 is the flexible multilayer construction of embodiment 10, wherein the at least a first side comprises two sides of the conductive via, and wherein, in a top plan view, each of the two sides is coincident with a corresponding minor side surface of the substrate extending between the top and bottom major surfaces.

Embodiment 14 is the flexible multilayer construction of embodiment 8, wherein the substrate, each top pad, and each bottom pad is rectangular, such that in a plan view, each via is positioned at a different vertex of the substrate with the vertex coinciding with vertices of the top and bottom pads corresponding to the via.

Embodiment 15 is the flexible multilayer construction of embodiment 8, wherein the first through fourth top pads define interconnecting grooves therebetween at least partially filled with an electrically insulative reflective material having an average reflectance of at least 70% in a visible range of the spectrum.

Embodiment 16 is the flexible multilayer construction of embodiment 1, wherein at least one of the first through fourth top pads extends laterally beyond the electrically conductive pad extending from the top pad.

Embodiment 17 is an LESD package, comprising: a flexible dielectric substrate comprising opposing top and bottom major surfaces and a common LESD mounting region on the top major surface, the common LESD mounting region having a maximum projected area less than about 1 mm$^2$; spaced apart electrically conductive first through fourth pads disposed entirely within the common LESD mounting region; an electrically conductive via extending from each of the first through fourth pads to the bottom major surface; and first through third LESDs mounted in the common LESD mounting region, an electrically conductive first terminal of each LESD in the first through at least third LESDs electrically connected to a different pad in the first through fourth pads, electrically conductive second terminals of at least two LESDs in the first through third LESDs electrically connected to a same pad in the first through fourth pads, such that each of the first through third LESD is independently energizable.

Embodiment 18 is the LESD package of embodiment 17, wherein the first terminal of each LESD is connected to a different pad in the first through third pads, and the second terminals of all three LESDs are connected to the fourth pad.

Embodiment 19 is a flexible multilayer construction for mounting a plurality of light emitting semiconductor devices (LESDs), comprising: a flexible dielectric polygonal substrate having a plurality of sides intersecting at a plurality of vertices and comprising top and bottom major surfaces; a plurality of spaced apart electrically conductive top pads disposed on the top major surface of the substrate; a plurality of spaced apart electrically conductive bottom pads disposed on the bottom major surface of the substrate; and a plurality of electrically conductive vias extending between corresponding top and bottom pads, such that for each corresponding top and bottom pad: the top and bottom pads are each polygonal having a plurality of sides intersecting at a plurality of vertices, a first vertex of the top pad coincident with a first vertex of the bottom pad and a first vertex of the substrate, the sides of the top and bottom pads and the substrate intersecting at the first vertex and partially overlapping one another.

Embodiment 20 is a flexible multilayer construction for mounting a plurality of light emitting semiconductor devices (LESDs), comprising: a flexible dielectric substrate comprising top and bottom major surfaces; and pluralities of corresponding electrically conductive top and bottom pads disposed on the top and bottom major surfaces, respectively, an electrically conductive via connecting each pair of corresponding top and bottom pads, a side of each top pad partially overlapping a side of the corresponding bottom pad and a side of the substrate, such in a plan view, each top pad fully overlaps the corresponding bottom pad.

Embodiment 21 is an LESD package comprising four LEDs mounted on the flexible multilayer construction of embodiment 20.

Embodiment 22 is a method of fabricating a flexible multilayer construction for mounting a plurality of light emitting semiconductor devices (LESDs), comprising the steps of: forming a patterned multilayer film, comprising: providing a flexible substrate having opposing top and bottom major surfaces; forming a plurality of spaced apart electrically conductive first pads on the top major surface of the flexible substrate; forming a plurality of spaced apart electrically conductive second pads on the bottom major surface of the flexible substrate in a one to one correspondence with the first pads; and forming an electrically conductive path between corresponding first and second pads through the flexible substrate; and determining a plurality of cutting lines on the patterned multilayer film, the cutting lines dividing the first and second pads in each corresponding first and second pads and the conductive path connecting the first and second pads each into four sections; and singulating a flexible multilayer construction by cutting through the patterned multilayer film along the determined cutting lines, resulting in the flexible multilayer construction having a plurality of corresponding top and bottom pads connected by corresponding electrically conductive vias, each top and bottom pad extending to a side of the flexible multilayer construction.

Embodiment 23 is the method of embodiment 22, wherein the first and second pads are arranged in a two-dimensional regular array along different first (x) and second (y) directions.

Embodiment 24 is the method of embodiment 23, wherein the first and second directions are orthogonal to one another.

Embodiment 25 is the method of embodiment 23, wherein the cutting lines are along the first and second directions.

Embodiment 26 is the method of embodiment 22, wherein the steps of fabricating a flexible multilayer construction are carried out sequentially.

Embodiment 27 is the method of embodiment 22, wherein the cutting lines divide the first and second pads in each corresponding first and second pads and the conductive path connecting the first and second pads each into four substantially equal sections.

Embodiment 28 is the method of embodiment 22, wherein for each corresponding first and second pads, the first pad is larger, the second pad is smaller, and in a plan view, the second pad is centered inside the first pad.

Embodiment 29 is the method of embodiment 22, wherein the electrically conductive paths are vias filled with electrically conductive material.

Various embodiments of the invention have been described. These and other embodiments are within the scope of the following claims.

The invention claimed is:

1. A flexible multilayer construction for mounting first through third light emitting semiconductor devices (LESDs), comprising:
a flexible dielectric substrate comprising a top major surface, a bottom major surface, and a common LESD mounting region on the top major surface for receiving the first through third a LESDs, the common LESD mounting region having a maximum projected area less than about 0.25 mm$^2$;
spaced apart electrically conductive first through fourth top pads disposed entirely within the common LESD mounting region for electrically connecting to electrically conductive terminals of the first through third LESDs received in the common LESD mounting region; and
an electrically conductive via extending from each of the first through fourth top pads to the bottom major surface, such that when the first through third LESDs are received and electrically connected to the first through fourth top pads, each of the first through third LESDs can be independently energized, wherein an electrically conductive first terminal of each LESD is connected to a different pad in the first through third pads, and an electrically conductive second terminal of each of the three LESDs is connected to the fourth pad.

2. The flexible multilayer construction of claim 1, wherein the flexible multilayer construction and the common LESD mounting region are substantially coextensive and have substantially coincident perimeters.

3. The flexible multilayer construction of claim 1, wherein each top pad extends to an edge of the common LESD mounting region.

4. The flexible multilayer construction of claim 1, wherein the common LESD mounting region is configured to receive up to four LESDs.

5. The flexible multilayer construction of claim 1, wherein at least one of the first through fourth top pads extends laterally beyond the electrically conductive pad extending from the top pad.

6. An LESD package, comprising:
a flexible dielectric substrate comprising opposing top and bottom major surfaces and a common LESD mounting region on the top major surface, the common LESD mounting region having a maximum projected area less than about 1 mm$^2$;
spaced apart electrically conductive first through fourth pads disposed entirely within the common LESD mounting region;
an electrically conductive via extending from each of the first through fourth pads to the bottom major surface; and
first through third LESDs mounted in the common LESD mounting region, wherein an electrically conductive first terminal of each LESD is connected to a different pad in the first through third pads, and an electrically conductive second terminal of each of the three LESDs is connected to the fourth pad, such that each of the first through third LESDs is independently energizable.

7. A flexible multilayer construction for mounting a plurality of light emitting semiconductor devices (LESDs), comprising:
a flexible dielectric polygonal substrate having a plurality of sides intersecting at a plurality of vertices and comprising top and bottom major surfaces;
a plurality of spaced apart electrically conductive top pads disposed on the top major surface of the substrate;
a plurality of spaced apart electrically conductive bottom pads disposed on the bottom major surface of the substrate; and
a plurality of electrically conductive vias extending between corresponding top and bottom pads, such that for each corresponding top and bottom pad:

the top and bottom pads are each polygonal having a plurality of sides intersecting at a plurality of vertices, a first vertex of the top pad coincident with a first vertex of the bottom pad and a first vertex of the substrate, the sides of the top and bottom pads and the substrate intersecting at the first vertex and partially overlapping one another.

8. A flexible multilayer construction for mounting a plurality of light emitting semiconductor devices (LESDs), comprising:

a flexible dielectric substrate comprising top and bottom major surfaces; and pluralities of corresponding electrically conductive top and bottom pads disposed on the top and bottom major surfaces, respectively, an electrically conductive via connecting each pair of corresponding top and bottom pads, a side of each top pad partially overlapping a side of the corresponding bottom pad and a side of the substrate, such in a plan view, each top pad fully overlaps the corresponding bottom pad, where the top and bottom pads are each polygonal having a plurality of sides intersecting at a plurality of vertices, a first vertex of the top pad coincident with a first vertex of the bottom pad and a first vertex of the substrate, the sides of the top and bottom pads and the substrate intersecting at the first vertex and partially overlapping one another.

9. A method of fabricating a flexible multilayer construction for mounting a plurality of light emitting semiconductor devices (LESDs), comprising the steps of:

forming a patterned multilayer film, comprising:
providing a flexible substrate having opposing top and bottom major surfaces;
forming a plurality of spaced apart electrically conductive first pads on the top major surface of the flexible substrate;
forming a plurality of spaced apart electrically conductive second pads on the bottom major surface of the flexible substrate in a one to one correspondence with the first pads; and
forming an electrically conductive path between corresponding first and second pads through the flexible substrate; and determining a plurality of cutting lines on the patterned multilayer film, the cutting lines dividing the first and second pads in each corresponding first and second pads and the conductive path connecting the first and second pads each into four sections; and singulating a flexible multilayer construction by cutting through the patterned multilayer film along the determined cutting lines, resulting in the flexible multilayer construction having a plurality of corresponding top and bottom pads connected by corresponding electrically conductive vias, each top and bottom pad extending to a side of the flexible multilayer construction.

* * * * *